United States Patent
See et al.

(10) Patent No.: US 9,728,492 B1
(45) Date of Patent: Aug. 8, 2017

(54) STRIP TESTING OF SEMICONDUCTOR DEVICES

(71) Applicant: Infineon Technologies AG, Neubiberg (DE)

(72) Inventors: Thiong Zhou See, Melaka (MY); Wee Boon Tay, Melaka (MY); Lay Yeap Lim, Melaka (MY)

(73) Assignee: Infineon Technologies AG, Neubiberg (DE)

(*) Notice: Subject to any disclaimer, the term of this patent is extended or adjusted under 35 U.S.C. 154(b) by 0 days.

(21) Appl. No.: 15/162,871

(22) Filed: May 24, 2016

(51) Int. Cl.
*H01L 21/66* (2006.01)
*H01L 21/78* (2006.01)
*H01L 23/495* (2006.01)
*H01L 21/56* (2006.01)
*H01L 23/00* (2006.01)

(52) U.S. Cl.
CPC ...... *H01L 23/49537* (2013.01); *H01L 21/561* (2013.01); *H01L 21/7806* (2013.01); *H01L 22/14* (2013.01); *H01L 22/32* (2013.01); *H01L 24/17* (2013.01); *H01L 24/49* (2013.01); *H01L 2224/04042* (2013.01); *H01L 2224/48091* (2013.01)

(58) Field of Classification Search
CPC ............. H01L 22/32; H01L 23/495–23/49596
See application file for complete search history.

(56) References Cited

U.S. PATENT DOCUMENTS

| | | |
|---|---|---|
| 7,008,825 B1 | 3/2006 | Bancod et al. |
| 7,402,459 B2 | 7/2008 | Xiaochun et al. |
| 7,799,611 B2 | 9/2010 | Ramos et al. |
| 9,012,268 B2 | 4/2015 | Jaurigue et al. |
| 2011/0057298 A1 | 3/2011 | Ramos et al. |
| 2011/0111562 A1 | 5/2011 | San Antonio et al. |
| 2012/0066899 A1* | 3/2012 | Sirinorakul ............ H01L 22/14 29/705 |
| 2014/0138805 A1 | 5/2014 | Abbott |

* cited by examiner

*Primary Examiner* — Daniel Shook
(74) *Attorney, Agent, or Firm* — Dicke, Billig & Czaja, PLLC

(57) ABSTRACT

A strip of semiconductor devices includes a plurality of leadframes electrically isolated from each other, a plurality of semiconductor chips, and an encapsulation material. Each leadframe has a first surface and a second surface opposite to the first surface. At least one semiconductor chip of the plurality of semiconductor chips is electrically coupled to the first surface of each leadframe. The encapsulation material encapsulates each semiconductor chip and at least portions of each leadframe.

21 Claims, 8 Drawing Sheets

STRIP TESTING OF SEMICONDUCTOR DEVICES

BACKGROUND

Semiconductor devices are typically tested after being fabricated and prior to packaging and shipping. The semiconductor devices may be individually tested or tested in a batch process. One type of batch process is strip testing. In strip testing, the semiconductor devices are tested within an assembly production line while the semiconductor device are grouped in a strip of semiconductor devices.

For these and other reasons, there is a need for the present invention.

SUMMARY

One example of a strip of semiconductor devices includes a plurality of leadframes electrically isolated from each other, a plurality of semiconductor chips, and an encapsulation material. Each leadframe has a first surface and a second surface opposite to the first surface. At least one semiconductor chip of the plurality of semiconductor chips is electrically coupled to the first surface of each leadframe. The encapsulation material encapsulates each semiconductor chip and at least portions of each leadframe.

DETAILED DESCRIPTION

In the following Detailed Description, reference is made to the accompanying drawings, which form a part hereof, and in which is shown by way of illustration specific examples in which the disclosure may be practiced. In this regard, directional terminology, such as "top," "bottom," "front," "back," "leading," "trailing," etc., is used with reference to the orientation of the Figure(s) being described. Because components of examples can be positioned in a number of different orientations, the directional terminology is used for purposes of illustration and is in no way limiting. It is to be understood that other examples may be utilized and structural or logical changes may be made without departing from the scope of the present disclosure. The following detailed description, therefore, is not to be taken in a limiting sense, and the scope of the present disclosure is defined by the appended claims.

It is to be understood that the features of the various examples described herein may be combined with each other, unless specifically noted otherwise.

As used herein, the term "electrically coupled" is not meant to mean that the elements must be directly coupled together and intervening elements may be provided between the "electrically coupled" elements.

To strip test semiconductor devices, the semiconductor devices are electrically isolated from each other. Semiconductor devices may be strip tested on mounting tape, which is used to hold the semiconductor devices in place after the semiconductor devices are singulated to electrically isolate the semiconductor devices from each other. Mounting tape, however, adds an additional cost to strip testing. In addition, inconsistent mounting tape expansion may cause inaccurate testing, which may prevent high temperature testing.

Accordingly, as described herein, a strip of semiconductor devices is partially cut to electrically isolate each semiconductor device while maintaining a connection between the semiconductor devices. Therefore, mounting tape is not needed to hold each semiconductor device in place for strip testing. After strip testing, the semiconductor devices are singulated by cutting the remaining portion of the connection between the semiconductor devices.

Figure 1A:
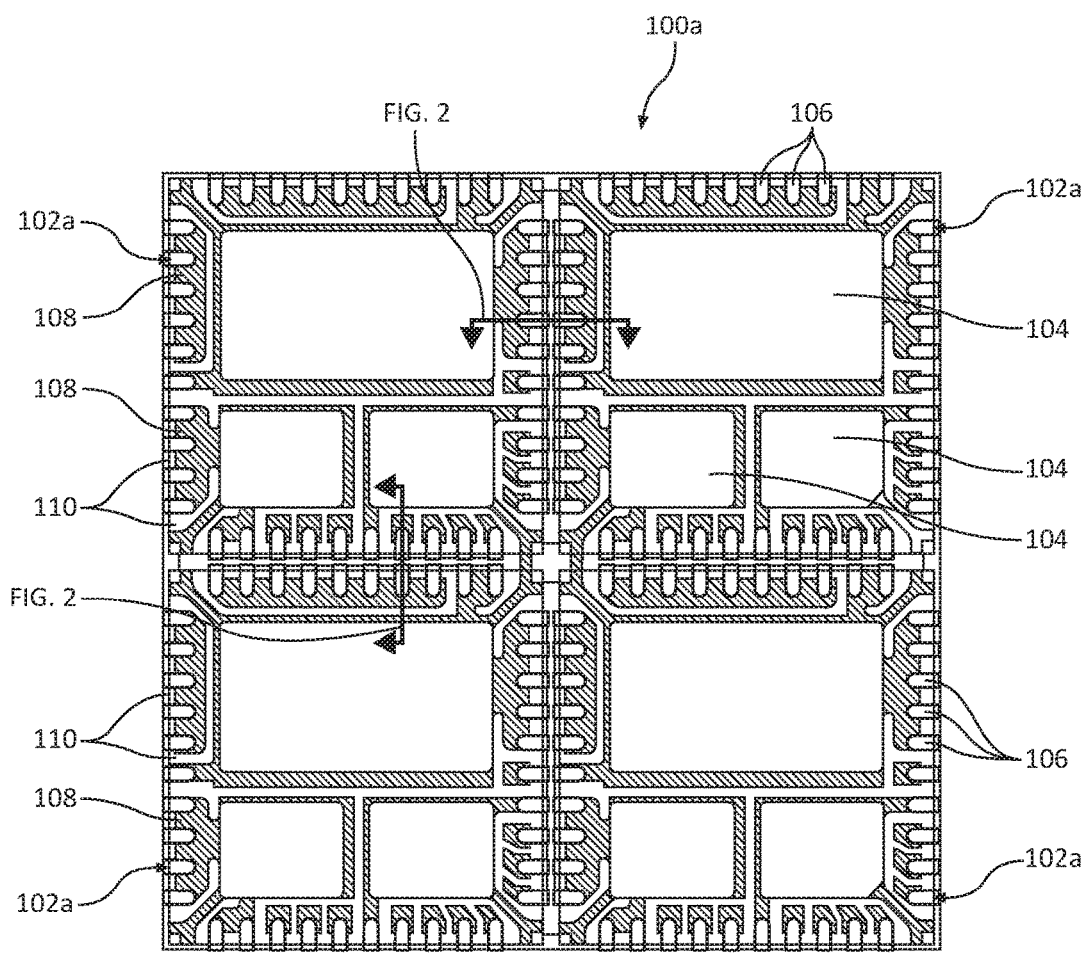
FIG. 1A illustrates a bottom view of one example of a strip of semiconductor devices including quad flat no-lead (QFN) leadframes.

FIG. 1A illustrates a bottom view of one example of a strip 100a of semiconductor devices. Strip 100a includes a plurality of quad flat no-lead (QFN) leadframes 102a, a plurality of semiconductor chips (not visible) where at least one semiconductor chip of the plurality of semiconductor chips is electrically coupled to each leadframe 102a, and encapsulation material 110 encapsulating the semiconductor chips and at least portions of leadframes 102a. While strip 100a includes four semiconductor devices, in other examples strip 100a may include any suitable number of semiconductor devices arranged in rows and/or columns. Each leadframe 102a includes die pads 104 and leads 106 on four sides of each leadframe. Each leadframe 102a includes exposed portions having surfaces aligned with the bottom surface of strip 100a. Each leadframe 102a also includes recessed portions 108 indicated by cross-hatching that are encapsulated in encapsulation material 110. Adjacent leadframes 102a are interconnected via recessed portions 108.

Figure 1B:
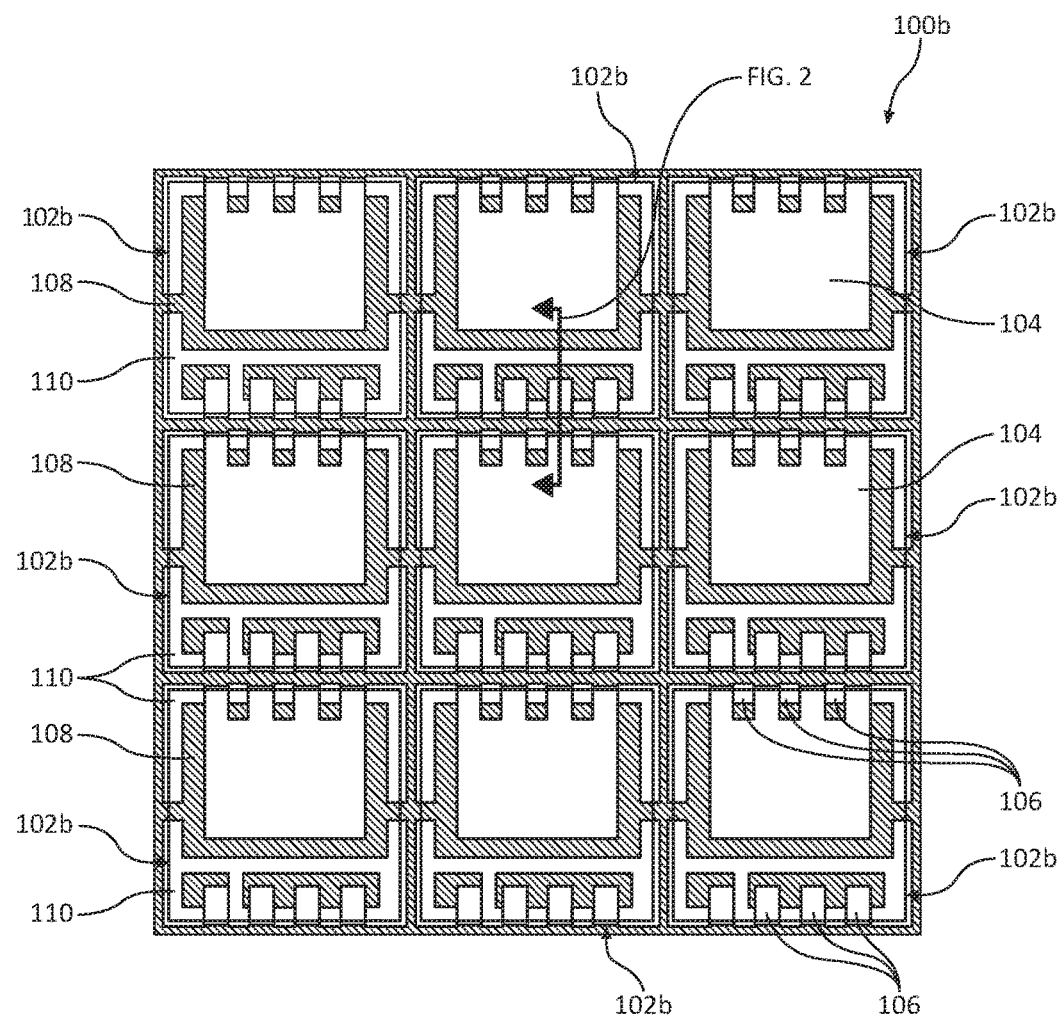
FIG. 1B illustrates a bottom view of one example of a strip of semiconductor devices including dual flat no-lead (DFN) leadframes.

FIG. 1B illustrates a bottom view of one example of a strip 100b of semiconductor devices. Strip 100b includes a plurality of dual flat no-lead (DFN) leadframes 102b, a plurality of semiconductor chips (not visible) where at least one semiconductor chip of the plurality of semiconductor chips is electrically coupled to each leadframe 102b, and encapsulation material 110 encapsulating the semiconductor chips and at least portions of leadframes 102b. While strip 100b includes nine semiconductor devices, in other examples strip 100b may include any suitable number of semiconductor devices arranged in rows and/or columns. Each leadframe 102b includes a die pad 104 and leads 106 on two sides of each leadframe. Each leadframe 102b includes exposed portions having surfaces aligned with the bottom surface of strip 100b. Each leadframe 102b also includes recessed portions 108 indicated by cross-hatching that are encapsulated in encapsulation material 110. Adjacent leadframes 102b are interconnected via recessed portions 108.

Figure 2:
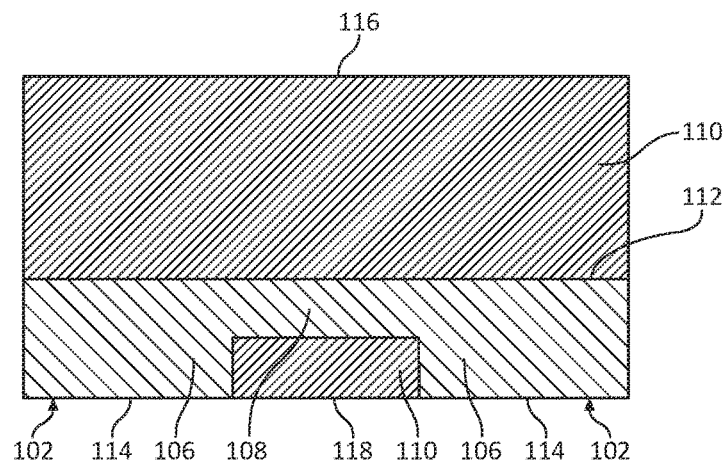
FIG. 2 illustrates a cross-sectional view of one example of an interconnection between leads of two adjacent leadframes as indicated in FIGS. 1A and 1B.

FIG. 2 illustrates a cross-sectional view of one example of an interconnection between leads 106 of two adjacent leadframes 102 (e.g., 102a or 102b) as indicated in FIGS. 1A and 1B, respectively. Each leadframe 102 includes a first surface 112 and a second surface 114 opposite to first surface 112. Each leadframe 102 is interconnected to adjacent leadframes 102 via portions 108. Encapsulation material 110 encapsulates both the upper and lower surfaces of portions 108. Encapsulation material 110 includes an exposed first surface 116 and an exposed second surface 118 opposite to first surface 116. The exposed surfaces 114 of leads 106 are aligned with the exposed surface 118 of encapsulation material 110 between leads 106 of adjacent leadframes 102.

Figure 3:
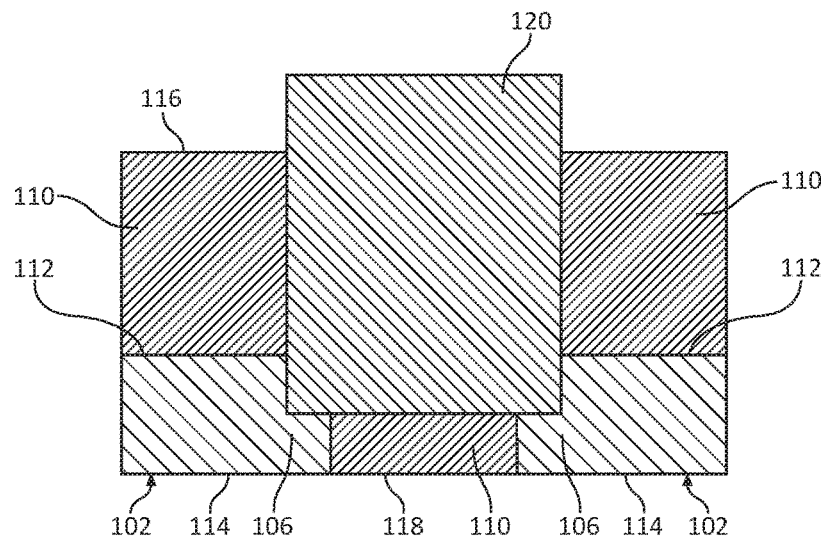
FIG. 3 illustrates a cross-sectional view of one example of partially cutting the strip of semiconductor devices to electrically isolate each leadframe.

FIG. 3 illustrates a cross-sectional view of one example of partially cutting the strip of semiconductor devices to electrically isolate each leadframe. Encapsulation material 110 and portion 108 between leads 106 of leadframes 102 are cut as indicated by 120 through surface 116 of encapsulation material 110 and surface 112 of leadframes 102 to electrically isolate each leadframe from adjacent leadframes. In one example, encapsulation material 110 and portion 108 between leads 106 of leadframes 102 are cut using a saw or another suitable tool. After the partial cutting, encapsulation material 110 remains coupling leads 106 of adjacent leadframes 102 together.

Figure 4:
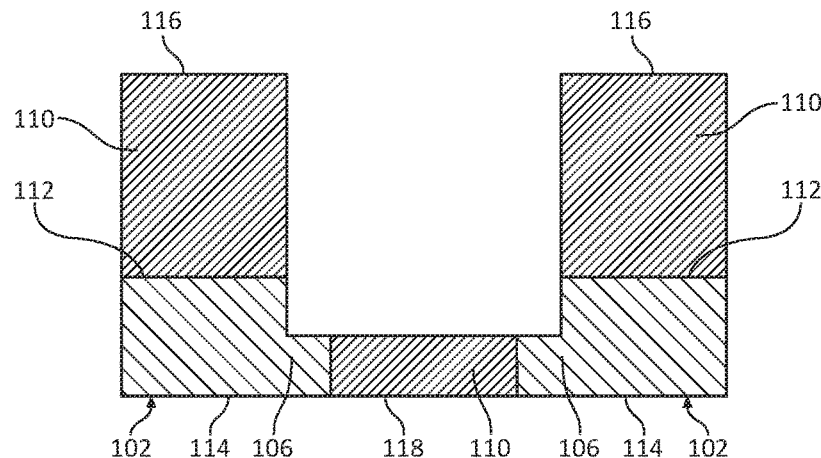
FIG. 4 illustrates a cross-sectional view of one example of the strip of semiconductor devices after partially cutting the strip of semiconductor devices.

FIG. 4 illustrates a cross-sectional view of one example of the strip of semiconductor devices after partially cutting the strip of semiconductor devices as previously described and illustrated with reference to FIG. 3. The partial cutting exposes a surface of each lead 106 between first surface 112 and second surface 114 of each leadframe 102. Leadframes 102 remain connected to each other via encapsulation material 110 between leads 106.

Figure 5:
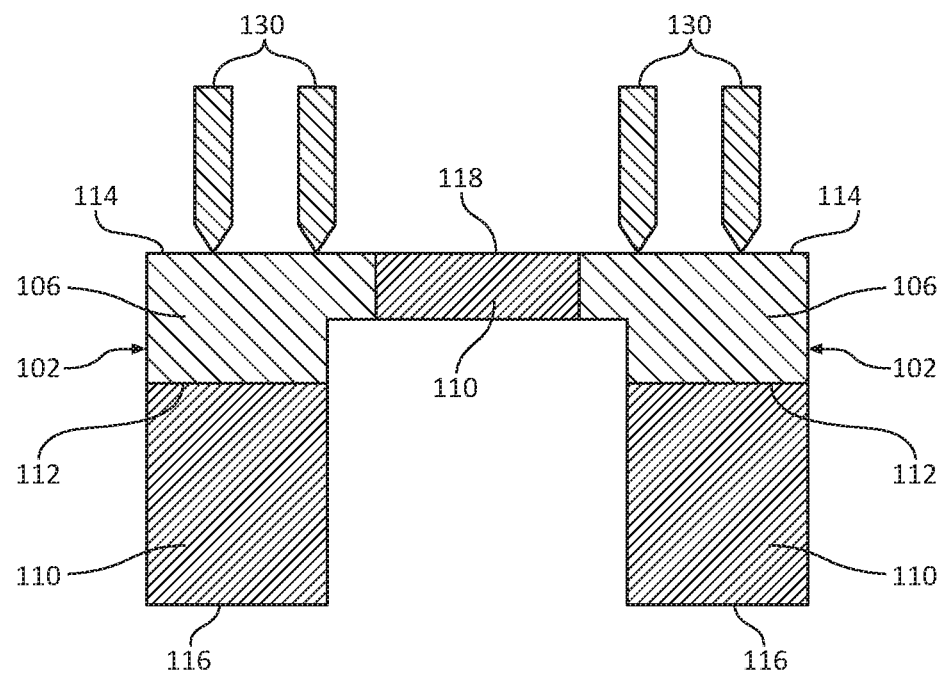
FIG. 5 illustrates a cross-sectional view of one example of strip testing the strip of semiconductor devices.

FIG. 5 illustrates a cross-sectional view of one example of strip testing the strip of semiconductor devices. Testing probes 130 may be brought into contact with second surface 114 of each lead 106 to test each semiconductor device while the semiconductor devices remain coupled together via encapsulation material 110.

Figure 6:
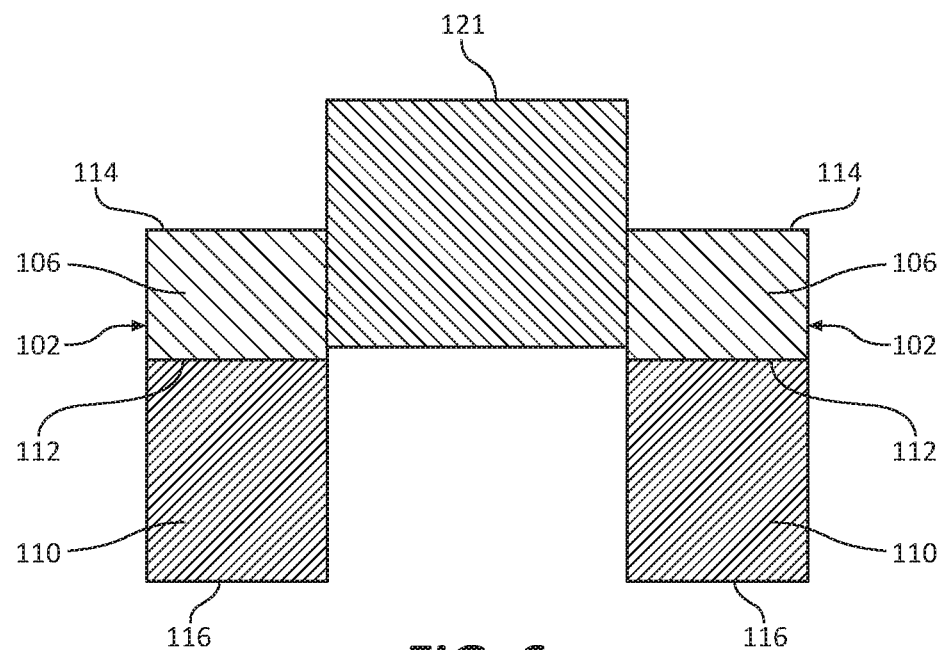
FIG. 6 illustrates a cross-sectional view of one example of singulating the strip of semiconductor devices.

FIG. 6 illustrates a cross-sectional view of one example of singulating the strip of semiconductor devices. After strip testing is completed as previously described and illustrated with reference to FIG. 5, the semiconductor devices are singulated by cutting the remaining portion of encapsulation material 110 between leads 106 of adjacent leadframes 102 as indicated by 121. Additional portions of leads 106 may also be cut during singulation. In one example, the strip may be cut from second surface 118 (FIG. 5) of encapsulation material 110 and second surface 114 of leadframes 102. The semiconductor devices may be cut using a saw or another suitable tool.

Figure 7A:
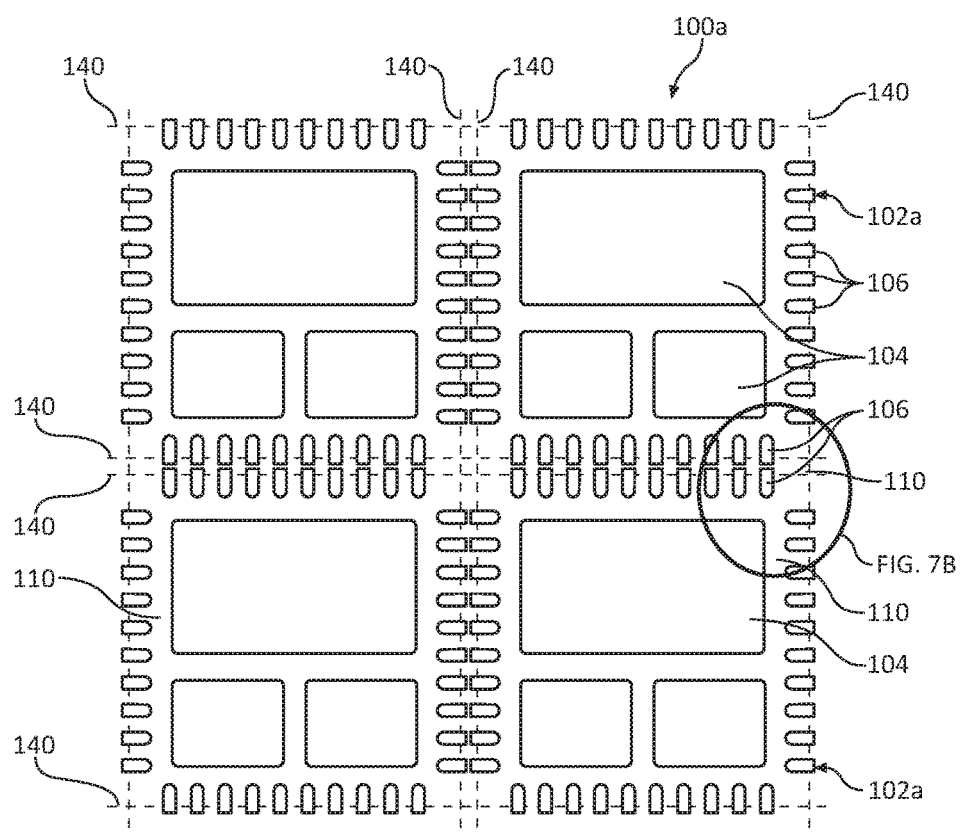
FIGS. 7A and 7B illustrate a bottom view and an exploded bottom view, respectively, of a strip of semiconductor devices.
Figure 7B:
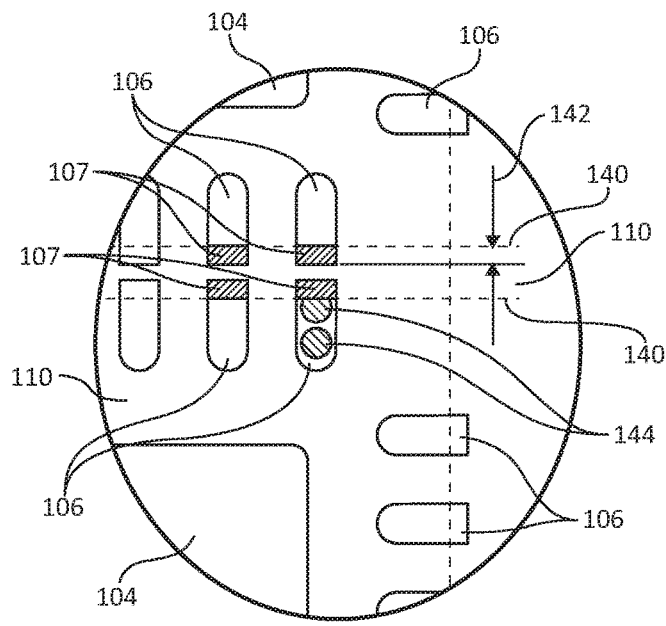

FIGS. 7A and 7B illustrate a bottom view and an exploded bottom view, respectively, of strip 100a of semiconductor devices. The bottom surface of strip 100a includes exposed surfaces of die pads 104 and leads 106 of leadframes 102a aligned with exposed surfaces of encapsulation material 110. In other examples, die pads 104 may not be exposed. Cut lines defining the outlines of individual semiconductor devices after singulation are indicated at 140. As shown in the exploded view of FIG. 7B, after the partial cutting along cut lines 140 as previously described with reference to FIG. 3, each lead 106 maintains a portion 107 between the cut lines 140. Each portion 107 of each lead 106 has a length as indicated at 142 (e.g., between 0.03 mm and 0.07 mm). The portions 107 of each lead 106 remain connected together via encapsulation material 110 after the partial cutting. Portions 107 provide an additional surface area in addition to the surface area provided by the other portions of leads 106 for strip testing contact points as indicated at 144. After strip testing, the semiconductor devices are singulated as previously described with reference to FIG. 6 along cut lines 140 such that portions 107 and encapsulation material 110 between leads 106 of adjacent leadframes 102a are removed.

Figure 8:
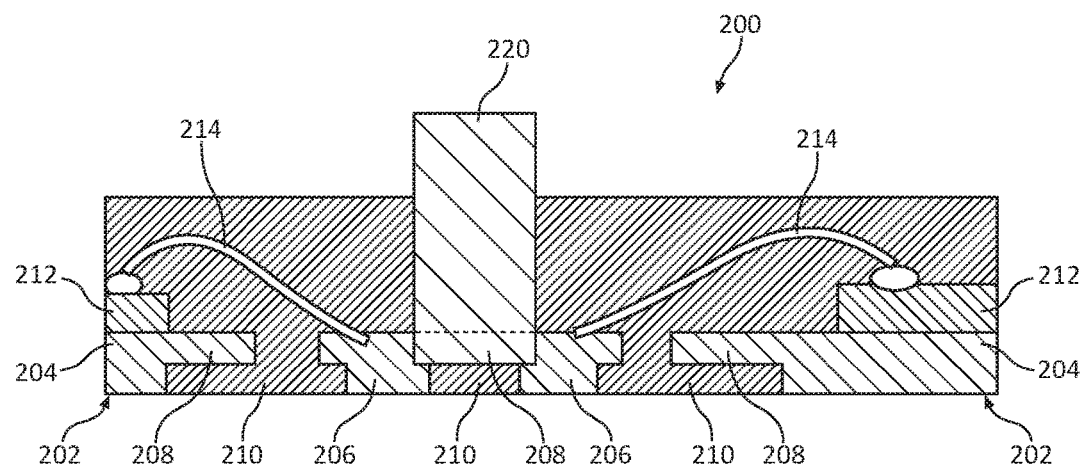
FIG. 8 illustrates a cross-sectional view of another example of partially cutting a strip of semiconductor devices to electrically isolate each leadframe for strip testing.

FIG. 8 illustrates a cross-sectional view of another example of partially cutting a strip 200 of semiconductor devices to electrically isolate each leadframe for strip testing. Strip 200 includes a plurality of leadframes 202, a plurality of semiconductor chips 212, bond wires 214, and encapsulation material 210. Each leadframe 202 includes a die pad 204 and leads 206. At least one semiconductor chip 212 is attached to each die pad 204 of a leadframe 202. The at least one semiconductor chip 212 may be electrically coupled to die pad 204 via solder or another suitable electrically conductive material or electrically isolated from die pad 204. Contacts on the upper surface of the at least one semiconductor chip 212 are electrically coupled to leads 206 of a leadframe 202 via bond wires 214. In other examples, the contacts on the upper surface of the least at one semiconductor chip 212 may be electrically coupled to leads 206 via ribbons, clips, or other suitable interconnects. Encapsulation material 210 (e.g., a mold material, an epoxy) encapsulates semiconductor chips 212, bond wires 214, and at least portions of leadframes 202.

Each leadframe 202 includes exposed surfaces aligned with the bottom surface of strip 200 and recessed portions 208 encapsulated in encapsulation material 210. Prior to partially cutting strip 200, adjacent leadframes 202 are interconnected via some of the recessed portions 208 as indicated by dashed lines. Strip 200 is partially cut to electrically isolate each leadframe 202 for strip testing while maintaining a connection via encapsulation material 210 between the leadframes. Encapsulation material 210 and the portions 208 between leads 206 of leadframes 202 are cut as indicated by 220. In one example, encapsulation material 210 and portions 208 between leads 206 of leadframes 202 are cut using a saw or another suitable tool. After the partial cutting, encapsulation material 210 remains coupling leads 206 of adjacent leadframes 202 together. As shown in FIG. 8, the partial cutting does not interfere with bond wires 214. After the partial cutting, strip 200 may be strip tested and then the semiconductor devices may be singulated.

Figure 9:
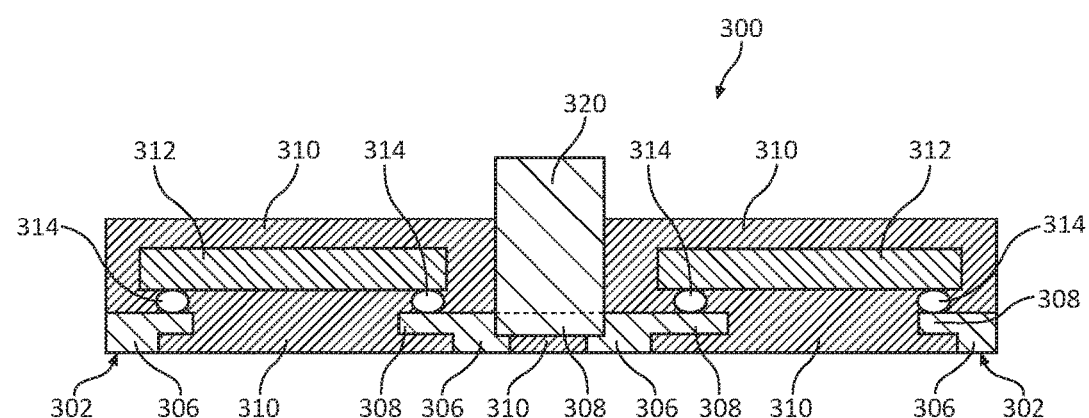
FIG. 9 illustrates a cross-sectional view of another example of partially cutting a strip of semiconductor devices to electrically isolate each leadframe for strip testing.

FIG. 9 illustrates a cross-sectional view of another example of partially cutting a strip 300 of semiconductor devices to electrically isolate each leadframe for strip testing. Strip 300 includes a plurality of leadframes 302, a plurality of semiconductor chips 312, solder 314, and encapsulation material 310. Each leadframe 302 includes leads 306. In this example, each semiconductor chip 312 is flip chip mounted to a leadframe 302 such that contacts of each semiconductor chip 312 are electrically coupled to leads 306 via solder 314. Encapsulation material 310 (e.g., a mold material, an epoxy) encapsulates semiconductor chips 312, solder 314, and portions of leadframes 302.

Each leadframe 302 includes exposed surfaces aligned with the bottom surface of strip 300 and recessed portions 308 encapsulated in encapsulation material 310. Prior to partially cutting strip 300, adjacent leadframes 302 are interconnected via some of the recessed portions 308 as indicated by dashed lines. Strip 300 is partially cut to electrically isolate each leadframe 302 for strip testing while maintaining a connection via encapsulation material 310 between the leadframes. Encapsulation material 310 and the portions 308 between leads 306 of leadframes 302 are cut as indicated by 320. In one example, encapsulation material 310 and portions 308 between leads 306 of leadframes 302 are cut using a saw or another suitable tool. After the partial cutting, encapsulation material 310 remains coupling leads 306 of adjacent leadframes 302 together. As shown in FIG. 9, the partial cutting does not interfere with semiconductor chips 312 or solder connections 314. After the partial cutting, strip 300 may be strip tested and then the semiconductor devices may be singulated.

Figure 10:
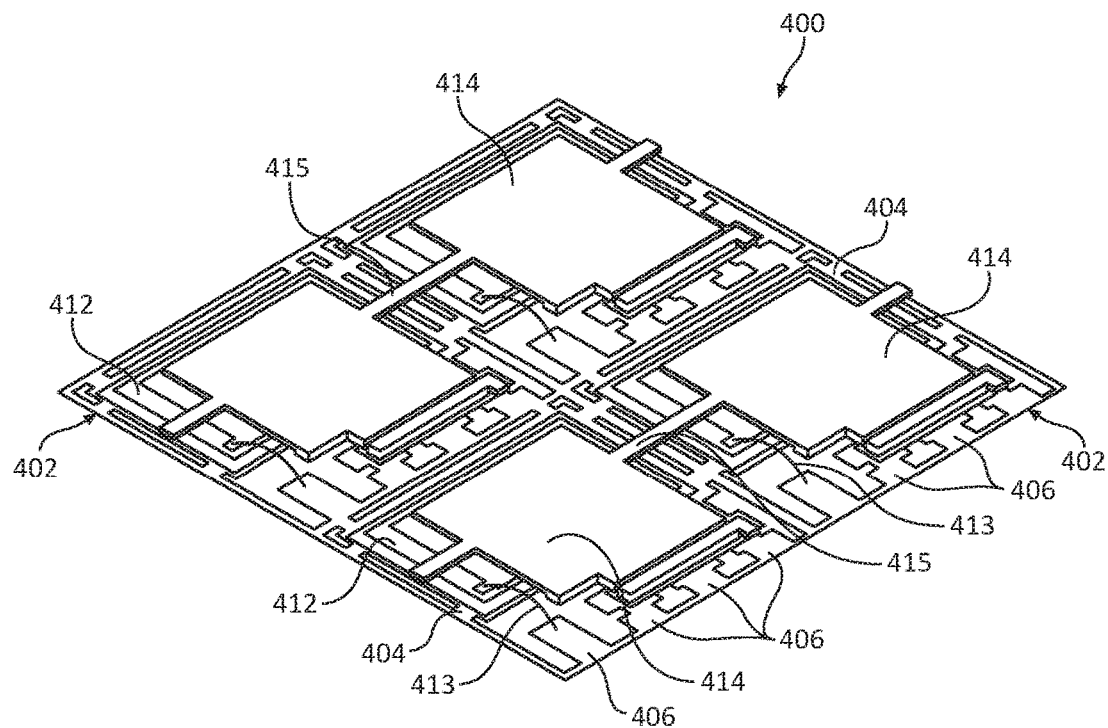
FIG. 10 illustrates a top view of one example of a strip of semiconductor devices with the encapsulation material removed.

FIG. 10 illustrates a top view of one example of a strip 400 of semiconductor devices with the encapsulation material removed. Strip 400 includes a plurality of leadframes 402, a plurality of semiconductor chips 412, and a plurality of clips 414. Each leadframe 402 includes at least one die pad 404 and leads 406. At least one semiconductor chip 412 is attached to each die pad 404 of a leadframe 402. Each semiconductor chip 412 may be electrically coupled to die pad 404 via solder or another suitable electrically conductive material or electrically isolated from die pad 404. A first contact on the upper surface of each semiconductor chip 412 is electrically coupled to leads 406 of a leadframe 402 via a clip 414. A second contact on the upper surface of each semiconductor chip 412 is electrically coupled to a lead 406 of a leadframe 402 via a bond wire 413. Each clip 414 is interconnected with adjacent clips 414 via at least one clip connection 415.

Figure 11:
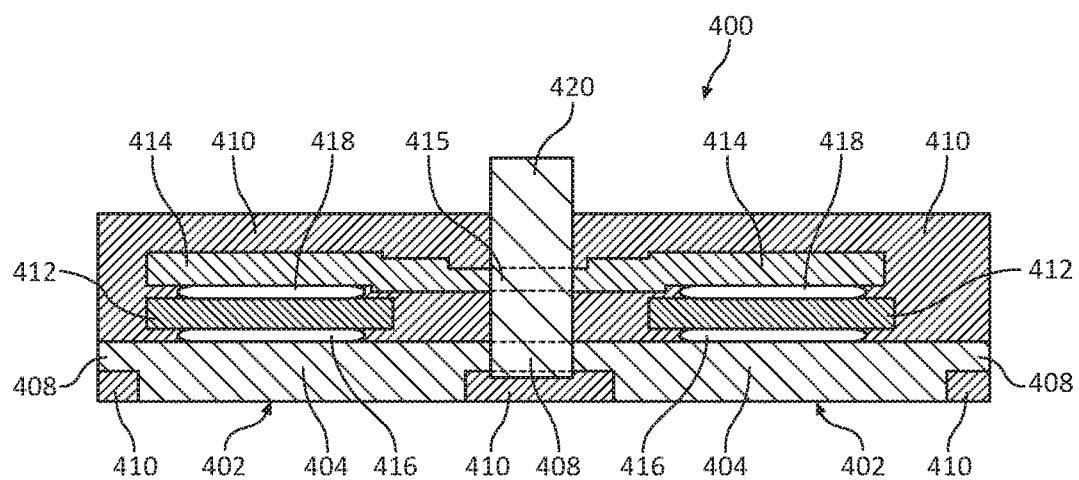
FIG. 11 illustrates a cross-sectional view of one example of partially cutting the strip of semiconductor devices of FIG. 10 to electrically isolate each leadframe and clip for strip testing.

FIG. 11 illustrates a cross-sectional view of one example of partially cutting the strip 400 of semiconductor devices of FIG. 10 to electrically isolate each leadframe and clip for strip testing. Strip 400 includes leadframes 402, semiconductor chips 412, clips 414, and encapsulation material 410. Each semiconductor chip 412 is attached to a die pad 404 of a leadframe 402 via a material 416 (e.g., solder). A contact on the upper surface of each semiconductor chip 412 is electrically coupled to leads 406 (FIG. 10) of a leadframe 402 via clip 414 and a material 418 (e.g., solder). Encapsulation material 410 (e.g., a mold material, an epoxy) encapsulates semiconductor chips 412, clips 414, bond wires 412 (FIG. 10), and portions of leadframes 402.

Each leadframe 402 includes exposed surfaces aligned with the bottom surface of strip 400 and recessed portions 408 encapsulated in encapsulation material 410. Prior to partially cutting strip 400, adjacent leadframes 402 are interconnected via some of the recessed portions 408 as indicated by dashed lines. Also prior to partially cutting strip 400, adjacent clips 414 are interconnected via clip connections 415 as indicated by dashed lines. Strip 400 is partially cut to electrically isolate each leadframe 402 and each clip 414 for strip testing while maintaining a connection via encapsulation material 410 between the leadframes. Encapsulation material 410, clip connections 415, and the portions 408 between leadframes 402 are cut as indicated by 420. In one example, encapsulation material 410, clip connections 415, and portions 408 between leadframes 402 are cut using a saw or another suitable tool. After the partial cutting, encapsulation material 410 remains couplings adjacent leadframes 402 together and a sidewall of each clip is exposed. After the partial cutting, strip 400 may be strip tested and then the semiconductor devices may be singulated.

Figure 12:
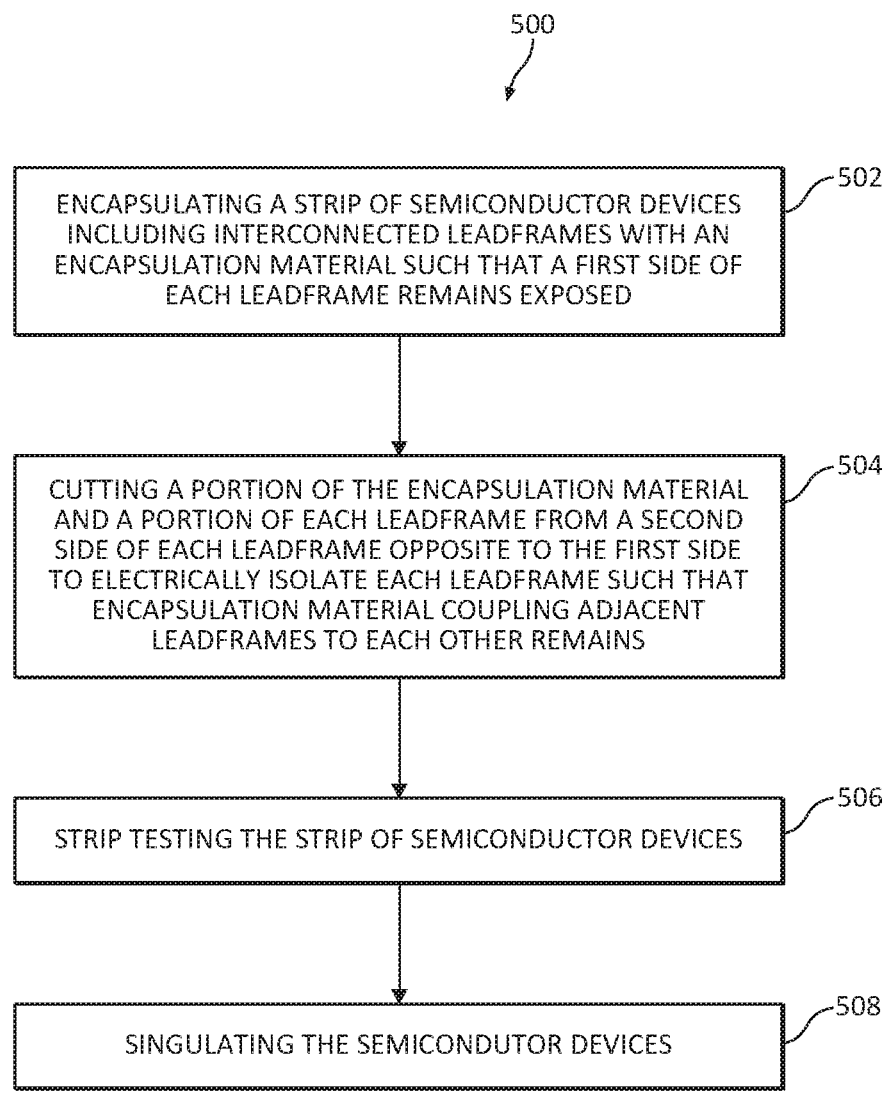
FIG. 12 is a flow diagram illustrating one example of a method for fabricating semiconductor devices.

FIG. 12 is a flow diagram illustrating one example of a method 500 for fabricating semiconductor devices. At 502, method 500 includes encapsulating a strip of semiconductor devices including interconnected leadframes with an encapsulation material such that a first side of each leadframe remains exposed. At 504, method 500 includes cutting a portion of the encapsulation material and a portion of each leadframe from a second side of each leadframe opposite to the first side to electrically isolate each leadframe such that encapsulation material coupling adjacent leadframes to each other remains. At 506, method 500 includes strip testing the strip of semiconductor devices. At 508, method 500 includes singulating the semiconductor devices.

The cutting at 504 may include sawing. Singulating the semiconductor devices at 508 may include cutting a portion of each leadframe. In one example, singulating the semiconductor devices at 508 may include cutting the encapsulation material coupling adjacent leadframes to each other from the first side of each leadframe. In another example, singulating the semiconductor devices at 508 may include sawing the encapsulation material coupling adjacent leadframes to each other from the first side of each leadframe.

Although specific examples have been illustrated and described herein, a variety of alternate and/or equivalent implementations may be substituted for the specific examples shown and described without departing from the scope of the present disclosure. This application is intended to cover any adaptations or variations of the specific examples discussed herein. Therefore, it is intended that this disclosure be limited only by the claims and the equivalents thereof.

The invention claimed is:

1. A method for fabricating a semiconductor device, the method comprising:
    encapsulating a strip of semiconductor devices including interconnected leadframes with an encapsulation material such that a first side of each leadframe remains exposed;
    cutting a portion of the encapsulation material and a portion of each leadframe from a second side of each leadframe opposite to the first side to electrically isolate each leadframe such that encapsulation material coupling adjacent leadframes to each other remains;
    strip testing the strip of semiconductor devices; and
    singulating the strip of semiconductor devices.

2. The method of claim 1, wherein singulating the strip of semiconductor devices comprises cutting a portion of each leadframe.

3. The method of claim 1, wherein the cutting comprises sawing.

4. The method of claim 1, wherein singulating the strip of semiconductor devices comprises cutting the encapsulation material coupling adjacent leadframes to each other from the first side of each leadframe.

5. The method of claim 1, wherein singulating the strip of semiconductor devices comprises sawing the encapsulation material coupling adjacent leadframes to each other from the first side of each leadframe.

6. A method for fabricating semiconductor devices, the method comprising:
    partially cutting through a strip of encapsulated semiconductor devices from a first side of the strip to electrically isolate each leadframe of a plurality of interconnected leadframes where a surface of each leadframe is exposed on a second side of the strip opposite to the first side;

strip testing the strip of encapsulated semiconductor device; and cutting through the strip of encapsulated semiconductor devices to singulate the semiconductor devices from each other.

7. The method of claim 6, wherein partially cutting through the strip of encapsulated semiconductor devices comprises cutting through a clip connection connecting clips of a plurality of interconnected clips where each clip is electrically coupled to a leadframe.

8. The method of claim 6, wherein cutting through the strip to singulate the semiconductor devices from each other comprises cutting through the strip from the second side.

9. The method of claim 6, wherein each semiconductor device comprises a semiconductor chip electrically coupled to a leadframe via bond wires.

10. The method of claim 6, wherein each semiconductor device comprises a semiconductor chip electrically coupled to a leadframe via solder.

11. The method of claim 6, wherein each leadframe comprises a quad flat no-lead (QFN) leadframe.

12. The method of claim 6, wherein each leadframe comprises a dual flat no-lead (DFN) leadframe.

13. A method for fabricating semiconductor devices, the method comprising:

providing a plurality of leadframes electrically interconnected via recessed portions, each leadframe having a first side and a second side opposite to the first side with each recessed portion defining a recess on the second side;

coupling at least one semiconductor chip to the first side of each leadframe;

encapsulating each semiconductor chip and at least portions of each leadframe with an encapsulation material to provide a strip of semiconductor devices such that each recess is filled with encapsulation material and such that an exposed surface of the encapsulation material is aligned with an exposed surface of each leadframe on the second side of each leadframe;

cutting a portion of the encapsulation material and at least a portion of each recessed portion from the first side of each leadframe to electrically isolate each leadframe such that encapsulation material coupling adjacent leadframes to each other remains;

strip testing the strip of semiconductor devices; and singulating the strip of semiconductor devices.

14. The method of claim 13, wherein singulating the strip of semiconductor devices comprises cutting a portion of each leadframe.

15. The method of claim 13, wherein singulating the strip of semiconductor devices comprises cutting the encapsulation material coupling adjacent leadframes to each other from the second side of each leadframe.

16. The method of claim 13, wherein the cutting comprises sawing.

17. The method of claim 13, further comprising:

electrically coupling each semiconductor chip to the first side of a leadframe via a clip of a plurality of interconnected clips, wherein the cutting comprises cutting through clip connections connecting the plurality of interconnected clips.

18. The method of claim 13, further comprising:

electrically coupling each semiconductor chip to a leadframe via bond wires.

19. The method of claim 13, further comprising:

electrically coupling each semiconductor chip to a leadframe via solder.

20. The method of claim 13, wherein each leadframe comprises a quad flat no-lead (QFN) leadframe.

21. The method of claim 13, wherein each leadframe comprises a dual flat no-lead (DFN) leadframe.

* * * * *